(12) United States Patent
Osawa et al.

(10) Patent No.: US 10,522,970 B2
(45) Date of Patent: Dec. 31, 2019

(54) LIGHT-EMITTING DEVICE

(71) Applicant: TOYODA GOSEI CO., LTD., Kiyosu-shi (JP)

(72) Inventors: Masaaki Osawa, Kiyosu (JP); Masao Kamiya, Kiyosu (JP); Satoshi Wada, Kiyosu (JP); Yuhki Kawamura, Kiyosu (JP); Kento Hayashi, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 16/226,867

(22) Filed: Dec. 20, 2018

(65) Prior Publication Data

US 2019/0305503 A1    Oct. 3, 2019

(30) Foreign Application Priority Data

Mar. 29, 2018 (JP) ................. 2018-064781

(51) Int. Cl.
| | |
|---|---|
| *H01S 5/00* | (2006.01) |
| *H01S 5/022* | (2006.01) |
| *H01S 5/042* | (2006.01) |
| *H01S 5/026* | (2006.01) |
| *H01S 5/40* | (2006.01) |

(52) U.S. Cl.
CPC ........ *H01S 5/02296* (2013.01); *H01S 5/0092* (2013.01); *H01S 5/0264* (2013.01); *H01S 5/02212* (2013.01); *H01S 5/042* (2013.01); *H01S 5/4093* (2013.01)

(58) Field of Classification Search
CPC .. H01S 5/02212; H01S 5/0092; H01S 5/4093; H01S 5/0264; H01S 5/02296
See application file for complete search history.

(56) References Cited

U.S. PATENT DOCUMENTS

| | | | | |
|---|---|---|---|---|
| 5,424,867 | A * | 6/1995 | Nihei | ............ G02F 1/3558 359/326 |
| 9,166,372 | B1 * | 10/2015 | McLaurin | ........... H01L 21/0243 |
| 2002/0172488 | A1 * | 11/2002 | Morikawa | ............. G02B 6/122 385/130 |
| 2003/0148565 | A1 * | 8/2003 | Yamanaka | ......... H01L 21/2026 438/200 |
| 2009/0126984 | A1 * | 5/2009 | Saneto | ................ H05K 9/0096 174/350 |

(Continued)

FOREIGN PATENT DOCUMENTS

| | | |
|---|---|---|
| JP | 2016-122715 A | 7/2016 |
| JP | 6044833 B2 | 12/2016 |

*Primary Examiner* — Kinam Park
(74) *Attorney, Agent, or Firm* — McGinn IP Law Group, PLLC

(57) ABSTRACT

A light-emitting device includes a laser diode element, a wavelength-converting member that absorbs light emitted from the laser diode element and converts wavelength of the light, and a transparent conductive film that is arranged on at least one of a light extracting-side surface and a laser diode element-side surface of the wavelength-converting member. The transparent conductive film is configured such that electrical resistance in a region overlapping the wavelength-converting member increases when the wavelength-converting member is damaged.

6 Claims, 9 Drawing Sheets

(56) References Cited

U.S. PATENT DOCUMENTS

2014/0071683 A1\* 3/2014 Hamada ................. G03B 21/14
                                                        362/259
2014/0072812 A1\* 3/2014 Hamada .............. H01S 5/02296
                                                        428/432

\* cited by examiner

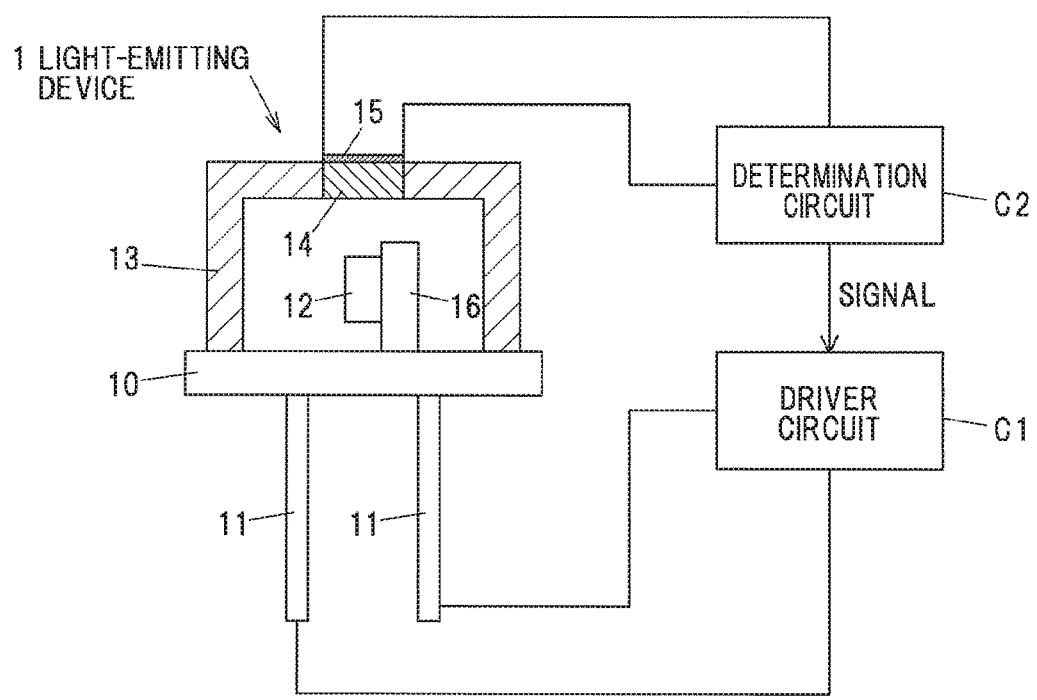

LIGHT-EMITTING DEVICE

The present application is based on Japanese patent application No. 2018-064781 filed on Mar. 29, 2018, the entire contents of which are incorporated herein by reference.

BACKGROUND OF THE INVENTION

1. Field of the Invention

The invention relates to a light-emitting device.

2. Related Art

A light-emitting device is known in which a through-hole formed on a package to extract light is covered with a wavelength-converting member which absorbs light emitted from a laser diode element and emits light with a different wavelength, and a crack-inducing portion is provided on a portion of the wavelength-converting member other than a portion immediately above the through-hole (see, e.g., JP 6044833 B).

JP 6044833 B indicates that, by inducing a crack in a specific region by the crack-inducing portion, it is possible to prevent cracks from occurring on the wavelength-converting member immediately above the through-hole. Also, it indicates that it is possible to prevent a phenomenon in which light emitted from the laser diode element passes through cracks and leaks out without being wavelength-converted.

Also, another light-emitting device is known in which a conductive film provided on a wavelength-converting member and a conductive portion provided on a mounting substrate are connected via bumps and form a closed circuit (see, e.g., JP 2016/122715 A).

JP 2016/122715 A indicates that, since the conduction status of the closed circuit changes when the wavelength-converting member is detached and comes off, it is possible to detect the detachment of the wavelength-converting member by monitoring the conduction status of the closed circuit. Also, it indicates that it is possible to prevent a phenomenon in which light emitted from the laser diode element leaks out without wavelength conversion due to the detachment and absence of the wavelength-converting member.

SUMMARY OF THE INVENTION

The light-emitting device of JP 6044833 B may have problems that there is no alternative but to visually check to detect occurrence of cracks, and that the device does not have any mechanism to stop laser light from being emitted in the event of occurrence of cracks. Thus, the occurrence of cracks may not be detected while allowing the unconverted light to be continuously emitted.

The light-emitting device of JP 2016/122715 A may be configured to detect detachment of the wavelength-converting member. However, if the wavelength-converting member is still attached, the occurrence of damage such as crack may not be detected. In this case, unconverted laser light may leak out through the damage.

It is an object of the invention to provide a light-emitting device that can accurately detect a damage on the wavelength-converting member so as to efficiently prevent laser light leakage due to the damage on the wavelength-converting member.

According to an embodiment of the invention, a light-emitting device defined by [1] to [6] below can be provided.

[1] A light-emitting device, comprising:
a laser diode element;
a wavelength-converting member that absorbs light emitted from the laser diode element and converts wavelength of the light; and
a transparent conductive film that is arranged on at least one of a light extracting-side surface and a laser diode element-side surface of the wavelength-converting member,
wherein the transparent conductive film is configured such that electrical resistance in a region overlapping the wavelength-converting member increases when the wavelength-converting member is damaged.

[2] The light-emitting device according to [1], wherein a thickness of the transparent conductive film in the region overlapping the wavelength-converting member is in the range of not less than 50 nm and not more than 2000 nm.

[3] The light-emitting device according to [1] or [2], wherein the transparent conductive film in the region overlapping the wavelength-converting member is in contact with the wavelength-converting member.

[4] The light-emitting device according to any one of [1] to [3], wherein the transparent conductive film in the region in contact with the wavelength-converting member comprises raised and recessed portions on a surface opposite to the wavelength-converting member.

[5] The light-emitting device according to any one of [1] to [4], further comprising a wiring(or wirings) electrically connected to the transparent conductive film of the light-emitting device and provided for connection to a determination circuit that sends a signal to stop power supply to the laser diode element from a driver circuit for driving laser diode element when electrical resistance of the transparent conductive film in the region in contact with the wavelength-converting member exceeds a predetermined value.

[6] The light-emitting device according to any one of [1] to [4], further comprising:
a driver circuit that is electrically connected to the laser diode element and drives the laser diode element; and
a determination circuit that is electrically connected to the transparent conductive film and sends a signal to stop power supply to the laser diode element from the driver circuit when electrical resistance of the transparent conductive film in the region in contact with the wavelength-converting member exceeds a predetermined value.

Effects of the Invention

According to an embodiment of the invention, a light-emitting device can be provided that can accurately detect a damage on the wavelength-converting member so as to efficiently prevent laser light leakage due to the damage on the wavelength-converting member.

BRIEF DESCRIPTION OF THE DRAWINGS

Next, the present invention will be explained in more detail in conjunction with appended drawings, wherein:

FIG. 3 is a schematic diagram illustrating a circuit configuration when a driver circuit for driving a laser diode element and a determination circuit for determining occurrence of damage on a wavelength-converting member are connected to the light-emitting device;

DESCRIPTION OF THE PREFERRED EMBODIMENTS

Embodiment

Configuration of Light-Emitting Device

Figure 1:
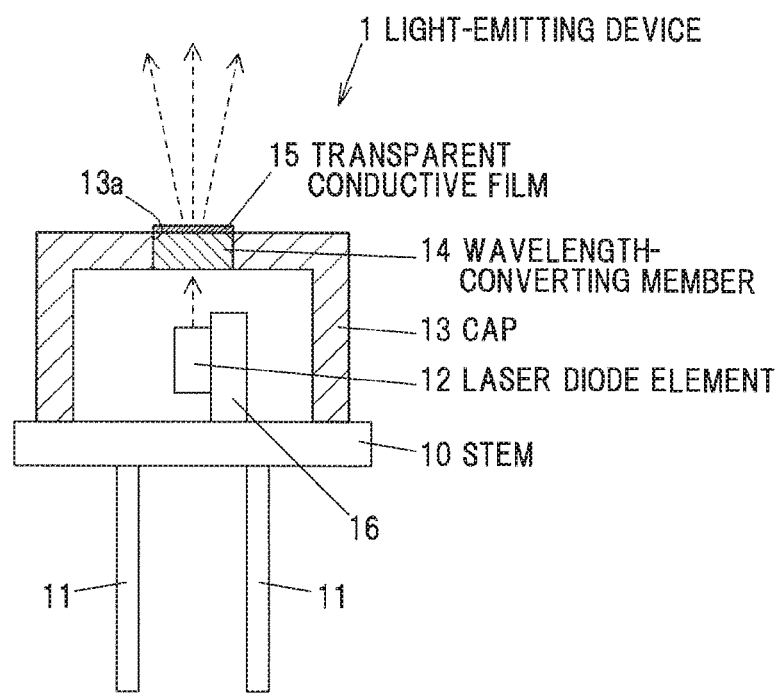
FIG. 1 is a vertical cross-sectional view showing a light-emitting device in an embodiment.

FIG. 1 is a vertical cross-sectional view showing a light-emitting device 1 in the embodiment. The light-emitting device 1 has a form called CAN package, and is provided with a stem 10 having electrode pins 11, a laser diode element 12 mounted on the stem 10, a cap 13 housing the laser diode element 12, a wavelength-converting member 14 fitted to an opening 13a which is a light extraction hole formed on the cap 13, and a transparent conductive film 15 arranged on a light extracting-side surface of the wavelength-converting member 14.

The stem 10 is formed of a metal material or an insulating material with a high thermal conductivity. The electrode pins 11 include an electrode pin connected to the n-pole of the laser diode element 12 and an electrode pin connected to the p-pole. The number of the electrode pins 11 is not limited to two.

The laser diode element 12 functions as an excitation light source for the wavelength-converting member 14. The laser diode element 12 in a state of being arranged on a base 16 is mounted on the stem 10.

The emission wavelength of the laser diode element 12 is not specifically limited and is appropriately selected according to, e.g., the material (absorption wavelength) of the wavelength-converting member 14 and color of light extracted from the light-emitting device 1. When, e.g., the laser diode element 12 emits blue light and the wavelength-converting member 14 exhibits yellow fluorescence, light which can be extracted from the light-emitting device 1 is white light as a mixture of yellow fluorescence and a portion of blue light extracted without being wavelength-converted by the wavelength-converting member 14.

The cap 13 is placed open-side down and fixed to the stem 10 so that the laser diode element 12 is housed therein. The material of the cap 13 is, e.g., stainless steel or iron, etc.

The wavelength-converting member 14 is located on the optical axis of the laser diode element 12, absorbs light emitted from the laser diode element 12 and converts wavelength of the light (emits light with a different wavelength).

The wavelength-converting member 14 is a member containing a phosphor which absorbs light emitted from the laser diode element 12 and emits fluorescence. The wavelength-converting member 14 is, e.g., a member containing phosphor particles in a base material such as alumina, glass or resin, or a sintered phosphor.

The phosphor contained in the wavelength-converting member 14 is not specifically limited and may be, e.g., a yellow phosphor such as YAG (Yttrium aluminum garnet) phosphor, α-SiAlON phosphor or BOS (Barium orthosilicate) phosphor, or may be a mixture of a green phosphor such as β-SiAlON phosphor and a red phosphor such as $(Ca,Sr)_2Si_5N_8$:Eu or $CaAlSiN_3$:Eu.

The planar shape of the wavelength-converting member 14 is typically a square, but may be a circle or a polygon other than square.

The transparent conductive film 15 is arranged on the wavelength-converting member 14 and is configured that electrical resistance in a region overlapping the wavelength-converting member 14 increases when the wavelength-converting member 14 is damaged. It is preferable that the transparent conductive film 15 cover the entire region of the light extracting-side surface of the wavelength-converting member 14.

In detail, in case that the wavelength-converting member 14 is damaged, e.g., cracked, due to temperature rise, the transparent conductive film 15 in the region overlapping the wavelength-converting member 14 is damaged along with the damage on the wavelength-converting member 14 even when the damage on the wavelength-converting member 14 is very small. Thus, the resistance value of the transparent conductive film 15 increases according to the damage level of the transparent conductive film 15.

The transparent conductive film 15 is formed of a material having electrical conductivity and transparent to light emitted from the laser diode element 12, such as indium tin oxide (ITO), zinc oxide (ZnO), graphene or indium zinc oxide (IZO).

The thickness of the transparent conductive film 15 in the region overlapping the wavelength-converting member 14 is preferably not less than 50 nm, more preferably not less than 400 nm, so that cracks can easily occur thereon along with the damage on the wavelength-converting member 14. However, the larger the thickness, the smaller the transmittance and the lower the luminous efficiency of the light-emitting device 1. Therefore, the thickness of the transparent conductive film 15 in the region overlapping the wavelength-converting member 14 is preferably not more than 2000 nm.

In addition, the transparent conductive film 15 is preferably formed directly on the wavelength-converting member 14 by sputtering or vapor deposition so that cracks can easily occur thereon along with the damage on the wavelength-converting member 14. In other words, the transparent conductive film 15 in the region overlapping the wavelength-converting member 14 is preferably a sputtered film or a vapor-deposited film, etc., in contact with the wavelength-converting member 14.

When a film containing an adhesive or a dispersing agent, etc., is formed between the transparent conductive film 15 and the wavelength-converting member 14, the thickness of the film needs to be such that the transparent conductive film 15 does not lose its function of getting damaged along with the damage on the wavelength-converting member 14.

Figure 2:
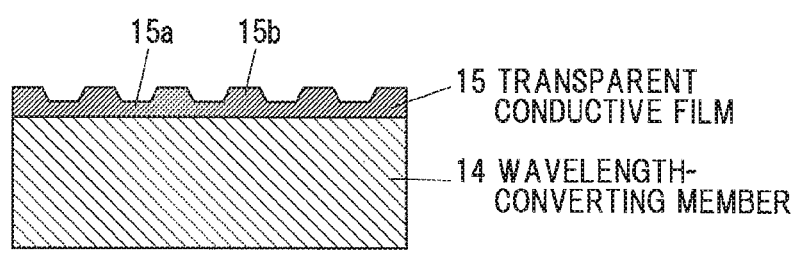
FIG. 2 is a vertical cross-sectional view showing an example configuration of a transparent conductive film.

FIG. 2 is a vertical cross-sectional view showing an example configuration of the transparent conductive film 15. Preferably, the transparent conductive film 15 in the region overlapping the wavelength-converting member 14 has raised and recessed portions on a surface opposite to the wavelength-converting member 14 (has a thickness distribution), as shown in FIG. 2.

In the configuration in which recessed portions 15a and raised portions 15b are provided on a surface of the transparent conductive film 15, damage such as crack is likely to occur on the recessed portions 15a having a small thickness. Thus, the transparent conductive film 15 in the region overlapping the wavelength-converting member 14 can be easily cracked along with the damage on the wavelength-converting member 14. The raised and recessed pattern composed of the recessed portions 15a and the raised portions 15b is not limited and can be, e.g., a stripe pattern or a dot pattern.

FIG. 3 is a schematic diagram illustrating a circuit configuration when a driver circuit C1 for driving the laser diode element 12 and a determination circuit C2 for determining occurrence of damage on the wavelength-converting member 14 are connected to the light-emitting device 1.

The driver circuit C1 is a circuit for driving the laser diode element 12 and supplies power to the laser diode element 12. Among the electrode pins 11, the electrode pin connected to the n-pole of the laser diode element 12 and the electrode pin connected to the p-pole are connected to the driver circuit C1.

The determination circuit C2 is electrically connected to the transparent conductive film 15 and sends a signal to the driver circuit C1 to stop power supply to the laser diode element 12 from the driver circuit C1 when electrical resistance of the transparent conductive film 15 in the region in contact with the wavelength-converting member 14 exceeds a predetermined value (a threshold).

The resistance value of the transparent conductive film 15 increases when the wavelength-converting member 14 is damaged, as described above. Thus, it is possible to determine occurrence of damage on the wavelength-converting member 14 by monitoring an increase in the resistance value of the transparent conductive film 15 using the determination circuit C2. It is preferable to monitor the resistance value of the transparent conductive film 15 in the entire contact region with the wavelength-converting member 14 by the determination circuit C2 so that occurrence of damage in the entire region of the wavelength-converting member 14 can be detected.

The determination circuit C2 is, e.g., a Wheatstone bridge circuit including a relay circuit. In this case, when the electrical resistance of the transparent conductive film 15 in the region in contact with the wavelength-converting member 14 exceeds a threshold, an electric current stops flowing through a coil of the relay circuit and the contact of the relay circuit electrically connected to the driver circuit C1 is turned off. Thus, power supply from the driver circuit C1 to the laser diode element is stopped.

The driver circuit C1 and the determination circuit C2 may be arranged either outside or inside the cap 13. In addition, the driver circuit C1 and the determination circuit C2 may be included in the structure of the light-emitting device 1. In this case, the light-emitting device 1 is composed of a CAN package having the laser diode element 12 as a light source, the driver circuit C1 and the determination circuit C2.

Figure 4A:
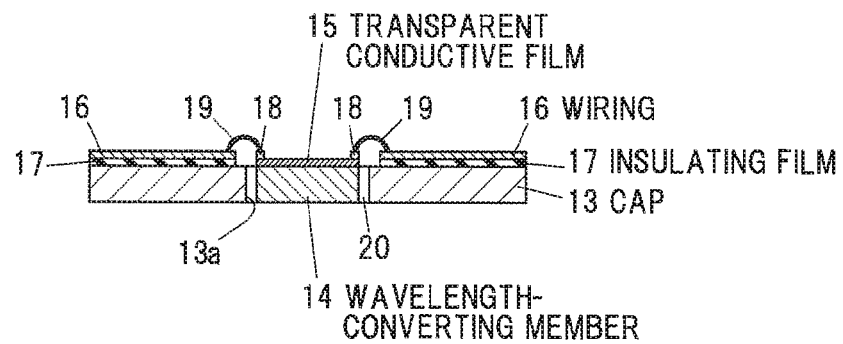
FIGS. 4A and 4B are an enlarged cross-sectional view and an enlarged top view showing an example of the configuration around the transparent conductive film in the light-emitting device.
Figure 4B:
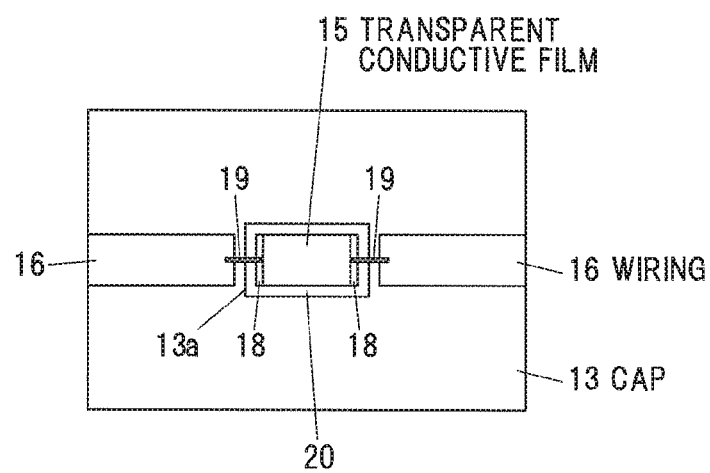

FIGS. 4A and 4B are an enlarged cross-sectional view and an enlarged top view showing an example of the configuration around the transparent conductive film 15 in the light-emitting device 1.

In the example shown in FIGS. 4A and 4B, wirings 16 for connection to the determination circuit C2 are formed on a surface of the cap 13. Two electrodes 18 are formed on a surface of the transparent conductive film 15 and are respectively connected to conductive wires 19. The transparent conductive film 15 is electrically connected to the wirings 16 via the electrodes 18 and the conductive wires 19.

In the example shown in FIGS. 4A and 4B, the transparent conductive film 15 covers the entire wavelength-converting member 14 and the electrodes 18 are formed at both longitudinal edges of the transparent conductive film 15 and cover the edges throughout the lateral width. Therefore, it is possible to monitor the resistance value of the transparent conductive film 15 in the entire contact region with the wavelength-converting member 14 by the determination circuit C2 and thereby possible to determine occurrence of damage in the entire region of the wavelength-converting member 14.

The wirings 16 are formed on the cap 13 via insulating films 17 and are thus insulated from the cap 13. When the cap 13 has insulation properties, the insulating films 17 are not required. Meanwhile, the wavelength-converting member 14 is fixed in the opening 13a of the cap 13 by an adhesive 20. The adhesive 20 is adhered to side surfaces of the wavelength-converting member 14 and side surfaces in the opening 13a of the cap 13.

The wiring 16 is formed of a conductive material such as gold, copper or aluminum. The insulating film 17 is formed of an insulating material such as fine ceramics or oxide silicon. The electrode 18 is formed of a conductive material such as gold or aluminum. The conductive wire 19 is formed of a conductive material such as gold, aluminum or copper. The adhesive 20 is an insulation adhesive such as silicone adhesive.

Figure 5A:
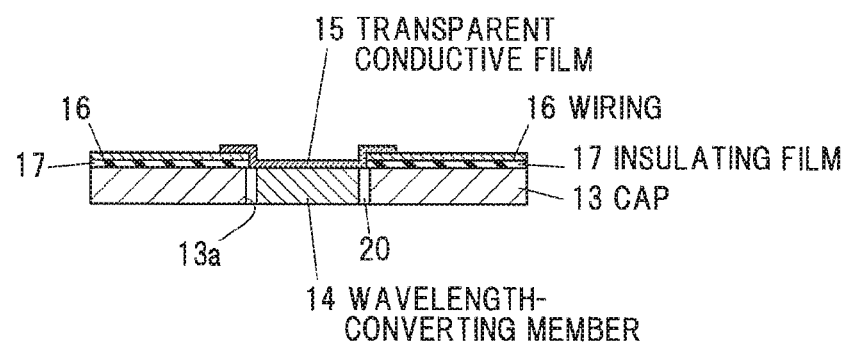
FIGS. 5A and 5B are an enlarged cross-sectional view and an enlarged top view showing another example of the configuration around the transparent conductive film in the light-emitting device.
Figure 5B:
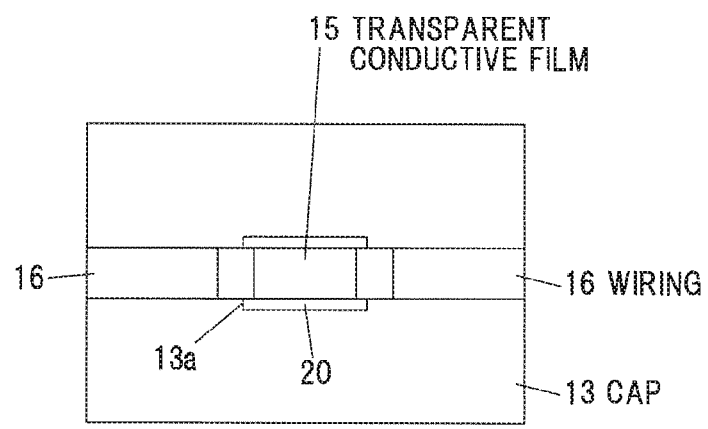

FIGS. 5A and 5B are an enlarged cross-sectional view and an enlarged top view showing another example of the configuration around the transparent conductive film 15 in the light-emitting device 1.

In the example shown in FIGS. 5A and 5B, the transparent conductive film 15 is long enough to cover edges of the wirings 16 and is directly connected to the wirings 16.

In the example shown in FIGS. 5A and 5B, the transparent conductive film 15 covers the entire wavelength-converting member 14 and the electrodes 18 are connected to the wirings 16 on both outer sides of the wavelength-converting member 14. Therefore, it is possible to monitor the resistance value of the transparent conductive film 15 in the entire contact region with the wavelength-converting member 14 by the determination circuit C2 and thereby possible to determine occurrence of damage in the entire region of the wavelength-converting member 14.

Figure 6A:
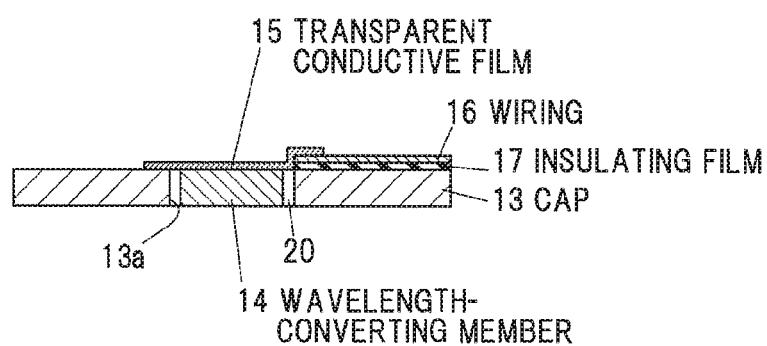
FIGS. 6A and 6B are an enlarged cross-sectional view and an enlarged top view showing another example of the configuration around the transparent conductive film in the light-emitting device.
Figure 6B:
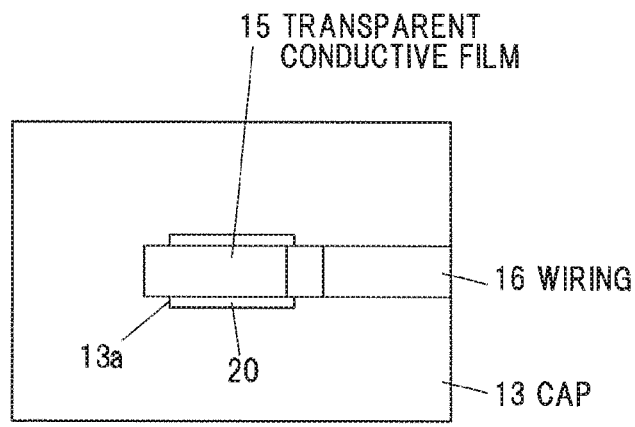

FIGS. 6A and 6B are an enlarged cross-sectional view and an enlarged top view showing another example of the configuration around the transparent conductive film 15 in the light-emitting device 1.

In the example shown in FIGS. 6A and 6B, a portion of the transparent conductive film 15 is connected to one wiring 16 and another portion of the transparent conductive film 15 is connected to the conductive cap 13 (a ground). In this case, the determination circuit C2 is connected to the wiring 16 and the ground.

In the example shown in FIGS. 6A and 6B, the transparent conductive film 15 covers the entire wavelength-converting member 14 and the electrodes 18 are connected to the wiring 16 and the cap 13 on both outer sides of the wavelength-converting member 14. Therefore, it is possible to monitor the resistance value of the transparent conductive film 15 in the entire contact region with the wavelength-converting member 14 by the determination circuit C2 and thereby possible to determine occurrence of damage in the entire region of the wavelength-converting member 14.

Figure 7A:
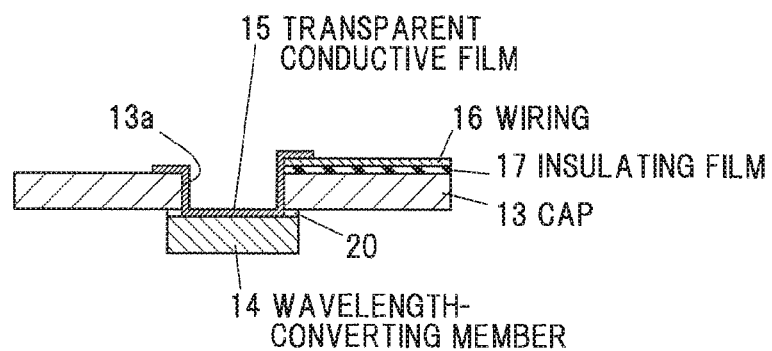
FIGS. 7A and 7B are an enlarged cross-sectional view and an enlarged top view showing another example of the configuration around the transparent conductive film in the light-emitting device.
Figure 7B:
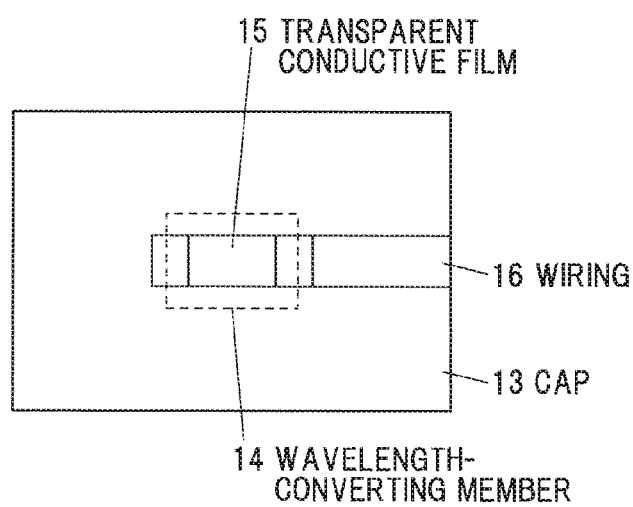
Figure 8A:
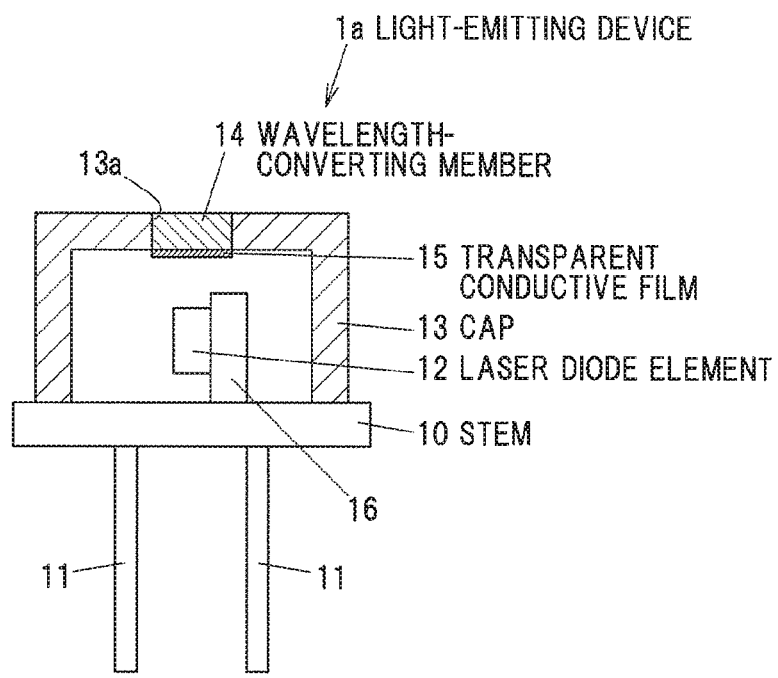
FIGS. 8A and 8B are vertical cross-sectional views showing modifications of the light-emitting device in the embodiment.
Figure 8B:
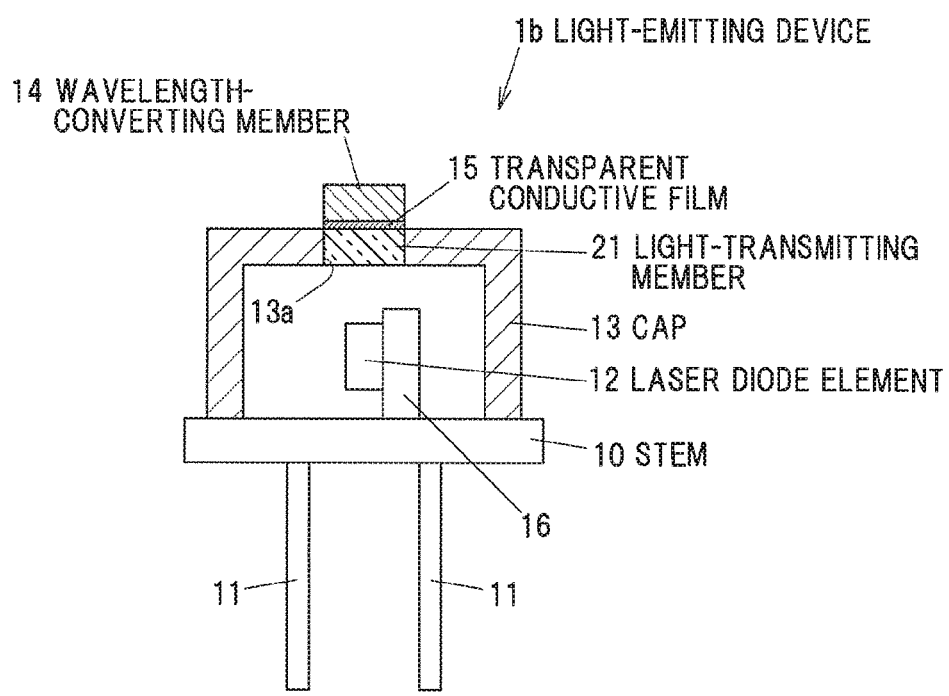
Figure 9A:
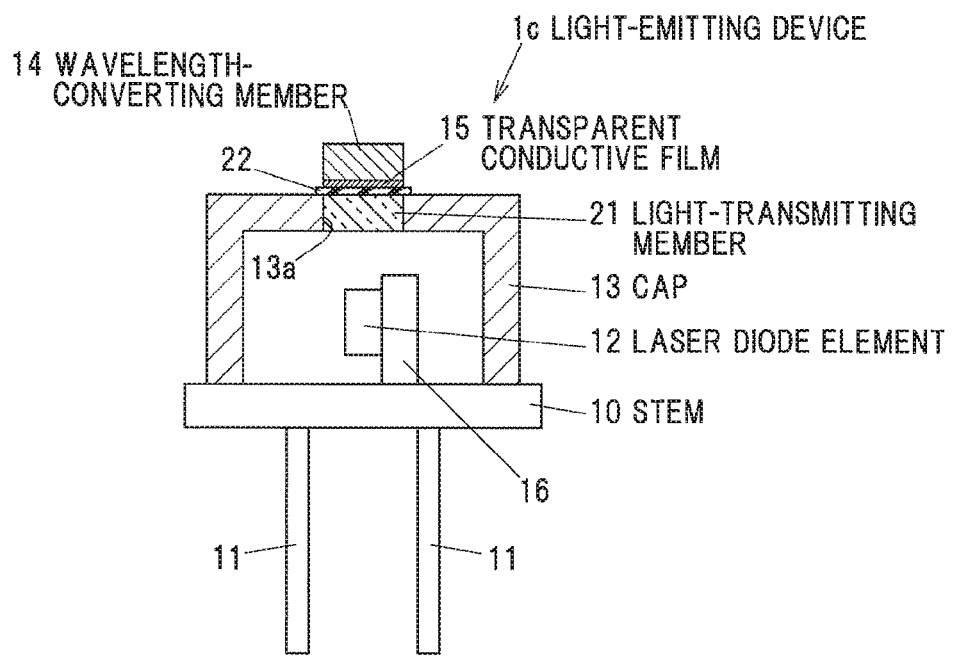
FIGS. 9A and 9B are vertical cross-sectional views showing modifications of the light-emitting device in the embodiment.
Figure 9B:
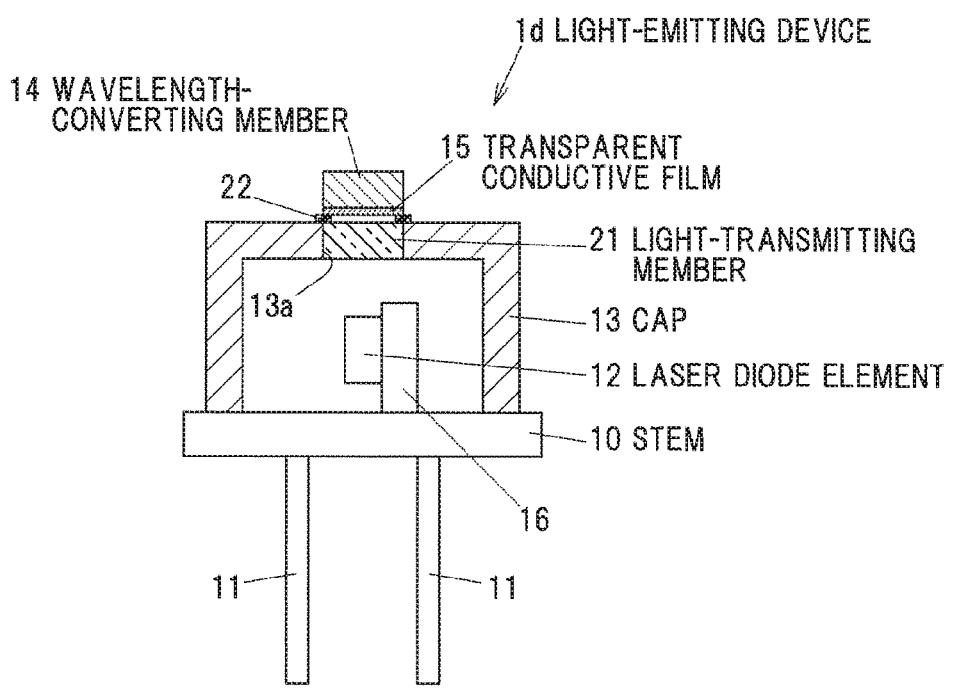

FIGS. 7A and 7B are an enlarged cross-sectional view and an enlarged top view showing another example of the configuration around the transparent conductive film 15 in the light-emitting device 1.

In the example shown in FIGS. 7A and 7B, the wavelength-converting member 14 is formed under the opening 13a of the cap 13. In detail, edges of the upper surface of the wavelength-converting member 14 are adhered to the inner surface of the cap 13 around the opening 13a by the adhesive 20. Then, a portion of the transparent conductive film 15 is connected to one wiring 16 and another portion of the transparent conductive film 15 is connected to the conductive cap 13 (a ground). In this case, the determination circuit C2 is connected to the wiring 16 and the ground.

In the example shown in FIGS. 7A and 7B, the wavelength-converting member 14 has a region exposed from the opening 13a, the transparent conductive film 15 covers the entire exposed region of the wavelength-converting member 14, and the electrodes 18 are connected to the wiring 16 and the cap 13 on both outer sides of the exposed region of the wavelength-converting member 14. Therefore, it is possible to monitor the resistance value of the transparent conductive film 15 in the entire contact region with the wavelength-converting member 14 by the determination circuit C2 and thereby possible to determine occurrence of damage in the entire exposed region of the wavelength-converting member 14 exposed from the opening 13a.

FIGS. 8A, 8B, 9A and 9B are vertical cross-sectional views showing light-emitting devices 1a, 1b, 1c and 1d which are modifications of the light-emitting device 1.

In the light-emitting device 1a, the transparent conductive film 15 is arranged on a surface of the wavelength-converting member 14 on the laser diode element 12 side. In this configuration, the wirings 16 for connection to the determination circuit C2 can be formed on the inner surface of the cap 13.

The method for connecting the transparent conductive film 15 to the wirings 16 or the cap 13 in the light-emitting device 1a can be the same method as when the transparent conductive film 15 is formed on the light extracting-side surface of the wavelength-converting member 14. Alternatively, the transparent conductive films 15 may be provided on both the light extracting-side surface and the laser diode element 12-side surface of the wavelength-converting member 14.

In the light-emitting device 1b, a light-transmitting member 21 is fitted to the opening 13a of the cap 13, and the transparent conductive films 15 and the wavelength-converting member 14 are stacked on the light-transmitting member 21. The light-transmitting member 21 is formed of a material which transmits light emitted from the laser diode element 12, e.g., a glass such as silica glass or sapphire glass, or a resin such as polycarbonate or acrylic.

The method for connecting the transparent conductive film 15 to the wirings 16 or the cap 13 in the light-emitting device 1b can be, e.g., the method shown in FIG. 5 or 6.

In the light-emitting devices 1c and 1d, the positions of the light-transmitting member 21, the transparent conductive film 15 and the wavelength-converting member 14 are the same as those in the light-emitting device 1b, but an insulating film 22 is formed between the light-transmitting member 21 and the transparent conductive film 15. In this configuration, when the cap 13 has conductivity and the method shown in FIG. 4 or 5 is used to connect the transparent conductive film 15 to the wirings 16, it is possible to reliably prevent short circuit between the transparent conductive film 15 and the cap 13.

The insulating film 22 may have a shape covering the entire lower surface of the transparent conductive film 15 as is the insulating film 22 in the light-emitting device 1c, or a shape covering edges of the lower surface of the transparent conductive film 15 as is the insulating film 22 in the light-emitting device 1d.

Effects of the Embodiment

According to the embodiment, it is possible to provide a light-emitting device which can accurately detect damage on a wavelength-converting member and thus can efficiently prevent laser light leakage due to the damage on the wavelength-converting member.

Although the embodiment of the invention has been described, the invention is not intended to be limited to the embodiment, and the various kinds of modifications can be implemented without departing from the gist of the invention. For example, although the CAN package has been described in the embodiment as an example of the light-emitting device of the invention, the light-emitting device of the invention may have another package form, such as surface-mount device (SMD). In addition, the constituent elements in the embodiment can be arbitrarily combined without departing from the gist of the invention.

In addition, the invention according to claims is not to be limited to the embodiment. Further, please note that all combinations of the features described in the embodiment are not necessary to solve the problem of the invention.

What is claimed is:

1. A light-emitting device, comprising:
   a laser diode element;
   a wavelength-converting member that absorbs light emitted from the laser diode element and converts wavelength of the light; and
   a transparent conductive film that is arranged on at least one of a light extracting-side surface and a laser diode element-side surface of the wavelength-converting member,
   wherein the transparent conductive film is configured such that electrical resistance in a region overlapping the wavelength-converting member increases when the wavelength-converting member is damaged.

2. The light-emitting device according to claim 1, wherein a thickness of the transparent conductive film in the region overlapping the wavelength-converting member is in the range of not less than 50 nm and not more than 2000 nm.

3. The light-emitting device according to claim 1, wherein the transparent conductive film in the region overlapping the wavelength-converting member is in contact with the wavelength-converting member.

4. The light-emitting device according to claim 1, wherein the transparent conductive film in the region in contact with the wavelength-converting member comprises raised and recessed portions on a surface opposite to the wavelength-converting member.

5. The light-emitting device according to claim 1, further comprising a wiring electrically connected to the transparent conductive film of the light-emitting device and provided for connection to a determination circuit that sends a signal to stop power supply to the laser diode element from a driver circuit for driving laser diode element when electrical resistance of the transparent conductive film in the region in contact with the wavelength-converting member exceeds a predetermined value.

6. The light-emitting device according to claim 1, further comprising:
   a driver circuit that is electrically connected to the laser diode element and drives the laser diode element; and
   a determination circuit that is electrically connected to the transparent conductive film and sends a signal to stop power supply to the laser diode element from the driver circuit when electrical resistance of the transparent conductive film in the region in contact with the wavelength-converting member exceeds a predetermined value.

* * * * *